(12) United States Patent
Kholodenko et al.

(10) Patent No.: US 6,676,760 B2
(45) Date of Patent: Jan. 13, 2004

(54) PROCESS CHAMBER HAVING MULTIPLE GAS DISTRIBUTORS AND METHOD

(75) Inventors: Arnold V. Kholodenko, San Francisco, CA (US); Dan Katz, Agoura Hills, CA (US); Wing L. Cheng, Sunnyvale, CA (US)

(73) Assignee: Appiled Materials, Inc., Santa Clara, CA (US)

( * ) Notice: Subject to any disclaimer, the term of this patent is extended or adjusted under 35 U.S.C. 154(b) by 0 days.

(21) Appl. No.: 09/930,938

(22) Filed: Aug. 16, 2001

(65) Prior Publication Data

US 2003/0033979 A1 Feb. 20, 2003

(51) Int. Cl.[7] .................... C23C 16/00; H05H 1/00
(52) U.S. Cl. ............... 118/728; 118/715; 118/726; 118/723 R; 156/345.33; 156/345.51
(58) Field of Search .................. 118/728, 726, 118/715, 723 I, 723 E, 723 R; 156/345.33, 345.34, 345.51, 345.48, 345.47

(56) References Cited

U.S. PATENT DOCUMENTS

| | | |
|---|---|---|
| 4,282,267 A | 8/1981 | Kuyel |
| 4,433,228 A | 2/1984 | Nishimatsu et al. |
| 4,576,692 A | 3/1986 | Fukuta et al. |
| 4,692,343 A | 9/1987 | Price et al. |
| 4,738,748 A | 4/1988 | Kisa |
| 4,818,326 A | 4/1989 | Liu et al. |
| 4,831,963 A | 5/1989 | Saito et al. |
| 4,863,561 A | 9/1989 | Freeman et al. |
| 4,867,841 A | 9/1989 | Loewenstein et al. |
| 4,935,661 A | 6/1990 | Heinecke et al. |
| 4,960,488 A | 10/1990 | Law et al. |
| 5,002,632 A | 3/1991 | Loewenstein et al. |
| 5,021,114 A | 6/1991 | Saito et al. |
| 5,024,182 A | 6/1991 | Kobayashi et al. |
| 5,062,386 A | 11/1991 | Christensen |

(List continued on next page.)

FOREIGN PATENT DOCUMENTS

| | | |
|---|---|---|
| DE | 4132559 | 4/1993 |
| EP | 410442 | 1/1991 |
| EP | 0555546 | 8/1993 |
| EP | 0697467 | 2/1996 |
| EP | 709875 | 5/1996 |
| EP | 790635 | 2/1997 |
| EP | 880164 | 11/1998 |
| JP | 62040728 | 8/1985 |
| JP | 61241930 | 10/1986 |
| JP | 61281519 | 12/1986 |
| JP | 63080841 | 4/1988 |
| JP | 63160334 | 7/1988 |
| JP | 2207528 | 8/1990 |
| JP | 4093016 | 3/1992 |
| JP | 5047707 | 2/1993 |

(List continued on next page.)

Primary Examiner—Parviz Hassanzadeh
(74) Attorney, Agent, or Firm—Ashok K. Janah; Joseph Bach

(57) ABSTRACT

A substrate processing chamber has a substrate support to support a substrate, and an exhaust conduit about the substrate support. A first process gas distributor directs a first process gas, such as a non-reactive gas, about the substrate perimeter and toward the exhaust conduit at a first flow rate to form a curtain of non-reactive gas about the substrate. A second process gas distributor directs a second process gas, such as reactive CVD or etchant gas, toward a central portion of the substrate at a second flow rate which is lower than the first flow rate. A gas energizer energizes the first and second process gases in the chamber. A controller operates the substrate support, gas flow meters, gas energizer, and throttle valve, to process the substrate in the energized gas.

22 Claims, 7 Drawing Sheets

U.S. PATENT DOCUMENTS

| | | |
|---|---|---|
| 5,084,126 A | 1/1992 | McKee |
| 5,158,644 A | 10/1992 | Cheung et al. |
| 5,183,510 A | 2/1993 | Kimura |
| 5,269,847 A | 12/1993 | Anderson et al. |
| 5,282,899 A | 2/1994 | Balmashnov et al. |
| 5,312,519 A | 5/1994 | Sakai et al. |
| 5,324,411 A | 6/1994 | Ichishima et al. |
| 5,356,478 A | 10/1994 | Chen et al. |
| 5,382,316 A | 1/1995 | Hills et al. |
| 5,389,197 A | 2/1995 | Ishimaru |
| 5,413,954 A | 5/1995 | Aydil et al. |
| 5,449,411 A | 9/1995 | Fukuda et al. |
| 5,455,070 A | 10/1995 | Anderson et al. |
| 5,487,785 A | 1/1996 | Horiike et al. |
| 5,522,934 A | 6/1996 | Suzuki et al. |
| 5,532,190 A | 7/1996 | Goodyear et al. |
| 5,556,521 A | 9/1996 | Ghanbari |
| 5,637,237 A | 6/1997 | Oehrlein et al. |
| 5,653,808 A | 8/1997 | MacLeish et al. |
| 5,665,640 A | 9/1997 | Foster et al. |
| 5,683,517 A | 11/1997 | Shan |
| 5,683,548 A | 11/1997 | Hartig et al. |
| 5,710,407 A | 1/1998 | Moore et al. |
| 5,767,628 A | 6/1998 | Keller et al. |
| 5,772,771 A | 6/1998 | Li et al. |
| 5,814,153 A | 9/1998 | Ishikawa |
| 5,939,831 A | 8/1999 | Fong et al. |
| 5,958,140 A * | 9/1999 | Arami et al. ............... 118/725 |
| 5,976,308 A | 11/1999 | Fairbairn et al. |
| 5,976,993 A | 11/1999 | Ravi et al. |
| 5,997,950 A | 12/1999 | Telford et al. |
| 6,012,478 A | 1/2000 | Park |
| 6,013,155 A * | 1/2000 | McMillin et al. ...... 156/345.33 |
| 6,026,762 A | 2/2000 | Kao et al. |
| 6,029,602 A | 2/2000 | Bhatnagar et al. |
| 6,039,834 A | 3/2000 | Tanaka et al. |
| 6,045,618 A | 4/2000 | Raoux et al. |
| 6,079,426 A | 6/2000 | Subramanyan et al. |
| 6,113,984 A | 9/2000 | MacLeish et al. |
| 6,125,859 A | 10/2000 | Kao et al. |
| 6,132,552 A * | 10/2000 | Donohoe et al. ...... 156/345.33 |
| 6,143,078 A * | 11/2000 | Ishikawa et al. ............ 118/715 |
| 6,165,311 A * | 12/2000 | Collins et al. ......... 156/345.26 |
| 6,170,428 B1 | 1/2001 | Redeker et al. |
| 6,179,924 B1 | 1/2001 | Zhao et al. |
| 6,182,602 B1 | 2/2001 | Redeker et al. |
| 6,185,839 B1 | 2/2001 | Kholodenko et al. |
| 6,432,259 B1 * | 8/2002 | Noorbakhsh et al. .. 156/345.33 |

FOREIGN PATENT DOCUMENTS

| | | |
|---|---|---|
| JP | 6124909 | 5/1994 |
| JP | 6132223 | 5/1994 |
| JP | 8100270 | 4/1996 |
| JP | 11111630 | 4/1999 |
| JP | 11204293 | 7/1999 |
| WO | 9615545 | 5/1996 |
| WO | 9800576 | 1/1998 |
| WO | WO 9957747 | 11/1999 |

* cited by examiner

PROCESS CHAMBER HAVING MULTIPLE GAS DISTRIBUTORS AND METHOD

BACKGROUND

Embodiments of the present invention relate to a substrate processing chamber for processing a substrate.

In the fabrication of electronic circuits, such as integrated circuits and flat panel displays, materials such as semiconductor, dielectric and conductor materials, for example, polysilicon, silicon dioxide, and metal containing materials, respectively, are formed on a substrate. Some of these materials are deposited by chemical vapor deposition (CVD) or physical vapor deposition (PVD) processes, and others may be formed by oxidation or nitridation of substrate materials. For example, in chemical vapor deposition processes, a deposition gas is introduced into the chamber and energized by heat and/or RF energy to deposit a film on the substrate. In physical vapor deposition, a target of sputtering material is sputtered to deposit a layer of the target material on the substrate. In etching processes, a patterned mask comprising a photoresist or hard mask material, is formed on the substrate surface by lithography, and the portions of the substrate surface that are exposed between the mask features are etched by an energized gas, such as a halogen-containing or oxygen-containing gas. Such deposition, etching, and planarization processes, are conducted in a sequence, to process the substrate to fabricate integrated circuits and other electronic devices.

In such processing methods, the flow pattern and distribution of process gas species in the chamber affects substrate processing uniformity, processing rates, and etching or deposition selectivity ratios. Some process chambers are designed with a gas flow distributor that provides a premixed gas composition into the chamber to improve processing uniformity. The premixed gas may include, for example, diluent and etchant gases, different types of deposition gases, or combinations of non-reactive and non-reactive gases. However, such gas distributors often cause inefficient utilization of the different components of the process gas and result in the release of an undesirably large amount of unconsumed non-reactive gas into the atmosphere. For example, some etch processes use as little as 10% of the non-reactive gases introduced into the chamber, the remaining 90% being exhausted from the chamber into the atmosphere. The unconsumed non-reactive gas may cause environmental problems, and consequently, may require abating or scrubbing before being exhausted, if the gas is toxic or otherwise hazardous. Also, conventional processing methods often do not allow the non-reactive and non-reactive gas flow pattern in the chamber to be adapted to different gas compositions or desired distributions, varying substrate processing requirements, or to compensate for different or asymmetrical exhaust port configurations.

Thus, it is desirable to have a chamber and gas distributor which can efficiently utilize the process gas introduced into the chamber. It is further desirable to be able to control the gas flow pattern and distribution of the different components of the process gas in the chamber to achieve the desired substrate processing characteristics. It is also desirable to be able to tune the process gas flow distribution into chamber to achieve the desired processing characteristics.

SUMMARY

A substrate processing chamber comprises a substrate support to support a substrate having a central portion and a perimeter, an exhaust conduit having a throttle valve, a first process gas distributor comprising one or more first gas outlets adapted to direct a first process gas about the substrate perimeter, and a first flow meter to regulate a first flow rate of the first process gas through the first gas outlets, a second process gas distributor comprising one or more second gas outlets adapted to direct a second process gas toward the central portion of the substrate, and a second flow meter to regulate a second flow rate of the second process gas through the second gas outlets, a gas energizer to energize the gases in the chamber, and a controller to operate the substrate support, first and second flow meters, gas energizer, and throttle valve, to process the substrate in an energized gas.

A substrate processing method comprises placing a substrate in a process zone, the substrate having a central portion and a perimeter about an exhaust zone, directing a first process gas at a first flow rate about the perimeter of the substrate, directing a second process gas at a second flow rate toward the central portion of the substrate, energizing the first and second process gases in the process zone to form an energized gas, and exhausting the energized gas via the exhaust zone.

A substrate processing chamber comprises a substrate support to support a substrate, an exhaust conduit at least partially about the substrate support, the exhaust conduit having a throttle valve, a gas distributor comprising (i) first gas outlets adapted to direct a non-reactive gas toward the exhaust conduit, and a first flow meter to regulate the flow of the non-reactive gas to a first flow rate, and (ii) second gas outlets adapted to direct a reactive gas toward the substrate support, and a second flow meter to regulate the flow rate of the reactive gas to a second flow rate, wherein the first flow rate is sufficiently higher than the second flow rate to form a curtain of the non-reactive gas about the reactive gas, a gas energizer to energize the gases in the chamber, and a controller to operate the substrate support, first and second flow meters, gas energizer, and throttle valve, to process a substrate in an energized gas.

A substrate processing method comprises placing a substrate in a process zone that is at least partially surrounded by an exhaust zone, the substrate having a central portion and a perimeter that borders the exhaust zone, directing a non-reactive gas at a first flow rate toward the exhaust zone and a reactive gas at a second flow rate toward the central portion of the substrate, wherein the first flow rate is sufficiently higher than the second flow rate to form a curtain of non-reactive gas about the reactive gas, energizing the gases in the process zone to process the substrate, and exhausting the gases through the exhaust zone.

DRAWINGS

These features, aspects, and advantages of the present invention will become better understood with regard to the following description, appended claims, and accompanying drawings which illustrate exemplary features of the invention. However, it is to be understood that each of the features can be used in the invention in general, not merely in the context of the particular drawings, and the invention includes any combination of these features, where:

FIG. 4a is a schematic sectional side view of yet another embodiment of the apparatus comprising a deposition chamber;

FIG. 4b is a top view of the gas distributor of the deposition chamber shown in FIG. 4a;

DESCRIPTION

Figure 1:
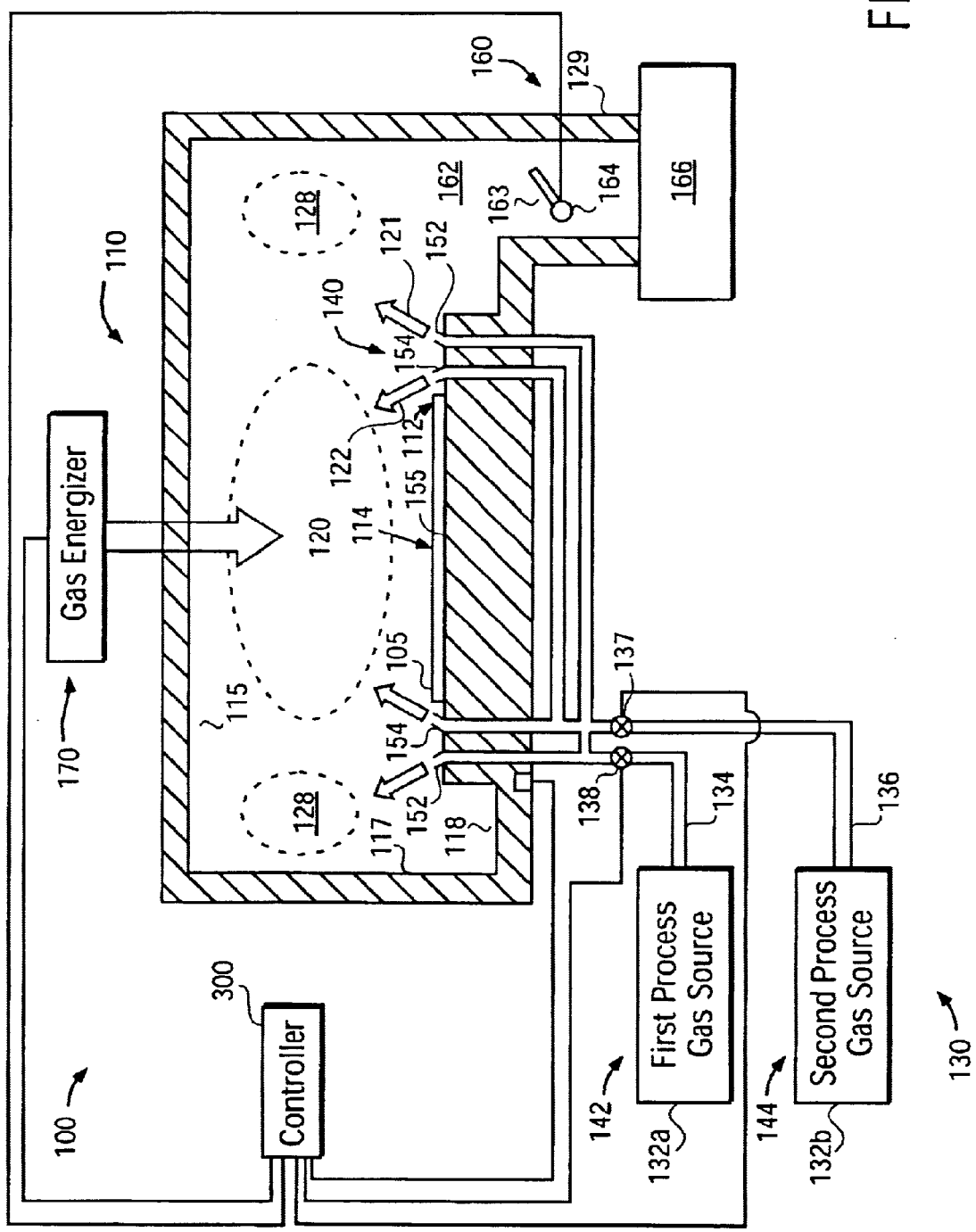
FIG. 1 is a schematic sectional side view of an apparatus according to an embodiment of the present invention.

An apparatus 100 that is useful for processing a substrate 105 to fabricate electronic circuits on the substrate 105 is shown in FIG. 1. Generally, the apparatus 100 comprises a process chamber 110 attached to a platform (not shown) that provides electrical, plumbing, and other support functions to the chamber 110. The chamber 110 comprises a ceiling 115, sidewall 117, and bottom wall 118, which are typically fabricated from a metal or ceramic material. A process zone 120 in the process chamber is above and about the substrate 105. To process a substrate, the chamber 110 is evacuated and maintained at a predetermined sub-atmospheric pressure. A substrate 105 is transported into the process zone 120 and placed on a substrate receiving surface 155 of a support 150. A process gas is introduced into the process chamber 110 through a gas supply 130 comprising a gas distribution system 140 that is fed by one or more process gas sources such as the first and second process gas sources 132a,b via the conduits 134, 136, respectively, and which have one or more flow meters 138, 137, thereon, respectively. Spent process gas and process byproducts are exhausted from the chamber 110 via an exhaust system 160 comprising an exhaust zone 128 at least partially about the process zone 120. The exhaust zone is about an exhaust conduit 162 that has one or more exhaust ports 163 about or around the substrate 105, and that opens to an exhaust line 129 having a throttle valve 164 to control the pressure of gas in the chamber 110, and one or more exhaust pumps 166 that typically including roughing and high vacuum-type pumps.

Figure 3A:
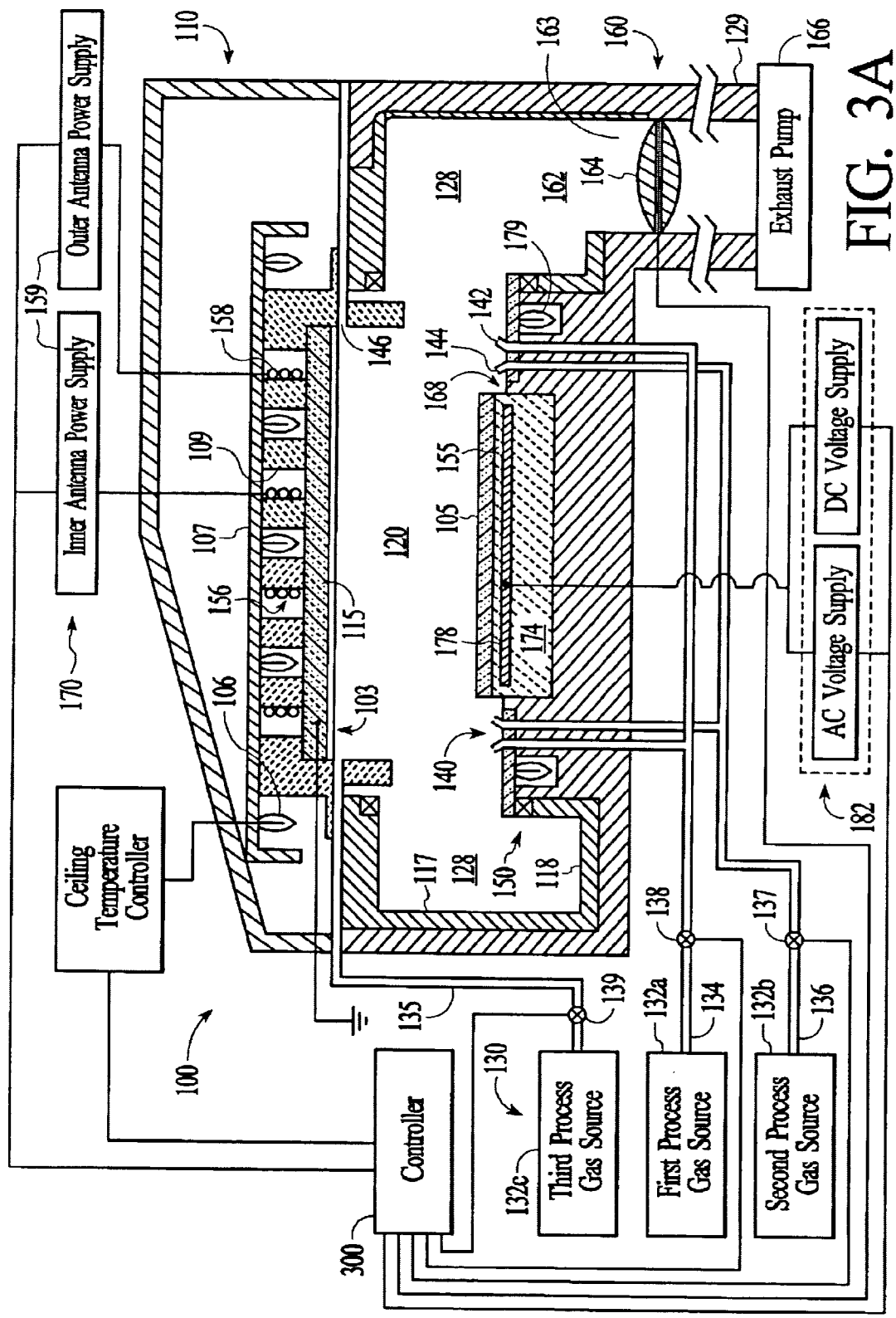
FIG. 3a is a schematic sectional side view of yet another embodiment of the apparatus comprising an etching chamber.

The process gas is energized to process the substrate 105 by a gas energizer 170 that couples energy to the gas in the process zone 120 of the chamber 110 (as shown) or in a remote zone upstream from the chamber 110 (not shown). In one version, the gas energizer 170 comprises an antenna 156 comprising one or more inductor coils which may have a circular symmetry about the center of the chamber 110, as shown in FIG. 3a. An antenna power supply 159 provides, for example, RF power to the antenna at a frequency of typically about 50 KHz to about 60 MHz, and more typically about 13.56 MHz; and at a power level of from about 100 to about 5000 Watts. Alternatively or additionally, the gas energizer 170 comprises process electrodes 103, 178, that are powered by a power supply 182 to energize the process gas as shown in FIG. 3A. The process electrodes may include an electrode 103 formed by a wall, such as a sidewall 117 or ceiling 115 of the chamber 110, and that may be capacitively coupled to another electrode 178 in the support 150 below the substrate 105. In yet another version, the gas energizer 170 may also comprise a microwave source and waveguide (not shown) to activate the process gas by microwave energy, for example, in a remote chamber. A controller 300 controls operation of the chamber components to process the substrate 105 in an energized gas.

One version of a gas distribution system 140 according to the present invention comprises one or more gas distributors, such as for example, a first process gas distributor 142 to introduce a first process gas into the chamber 110 and a second process gas distributor 144 to introduce a second process gas into the chamber 110, as shown in FIG. 1. The first and second process gases may be a single gas or a mixture of gases. The first and second process gas distributors 142, 144 may be adapted to introduce the first and second process gases into the chamber 110 so that the gases partially diffuse into one another to form a diffused process gas having a predetermined composition that is suitable for processing the substrate 105. The separate gas distributors 142, 144 allow control over mixing of the process gases in the localized environment above the substrate 105, by selecting the chamber locations where each process gases egresses into the chamber 110, the flow rates of the gases, and the pressure in the chamber 110. It has been discovered that such a gas distribution system 140 increases the utilization efficiency of the process gases by mixing of the first and second process gases inside the chamber 110 and controlling localized process gas residence time above the substrate 105. The chamber residence time which is affected by the gas flow rate and flow ingress and egress points in the chamber 110 may be more precisely controlled with the selectively localized gas flows.

In the embodiment, as shown in FIG. 1, the first process gas distributor 142 comprises one or more first gas outlets 152 adapted to direct a first process gas in a direction 121 that is about a substrate perimeter 112, and optionally, between the substrate perimeter 112 and the exhaust conduit 162. A first flow meter 138 is provided to control the flow of the first process gas passing through the first gas conduit 134 which terminates in the first gas outlets 152. A second process gas distributor 144 comprises one or more second gas outlets 154 adapted to direct a second process gas in a direction 122 that is toward a central portion 114 of the substrate 105 and radially inward of the flow direction 121 of the first process gas. A second flow meter 137 is provided to control the flow of the second process gas passing through the second gas conduit 136 which terminates in the second gas outlets 154. The first process gas flow provides a gas barrier curtain about the perimeter 112 of the substrate 105 that serves to contain the second process gas flow introduced into the chamber 110 substantially above the substrate 105 where the gas can efficiently process the substrate 105. The gas barrier reduces the consumption of the second process gas in the chamber 110 thereby allowing reduction of the flow rates of the second process gas and increasing its utilization efficiency.

The first and second process gases are also introduced into the chamber 110 at volumetric flow rates selected to generate a predetermined composition of the process gas above the substrate 105 through the migration and diffusion of one gas into the other gas. For example, the first gas may be provided through the first gas distributor 142 at a first volumetric flow rate regulated by a first flow meter 138 and the second process gas may be provided through the second process gas distributor 144 at a second volumetric flow rate regulated by a second flow meter 137. For example, in one version, the volumetric flow rate of the first process gas is higher than the volumetric flow rate of the second process gas. The volumetric flow rate of the first process gas is set higher in order to provide a higher concentration of, for example, a non-reactive diluent gas in the chamber 110. In one embodiment, the first gas distributor 142 is adapted to direct the first process gas into the chamber 110 and at a first velocity, and the second process gas distributor 144 is adapted flow the second process gas into the chamber 110 at a second velocity, the first velocity being higher than the second velocity. For example, the first velocity may be at least ten times higher than the second velocity. The higher first velocity forms a curtain of first process gas about the perimeter of the substrate 105 that serves as a diffusional barrier and reduces the migration or loss of the second process gas from the region above the substrate 105 to the exhaust zone 128 about the exhaust conduit 162. For example, the first process gas distributor 142 may provide a higher velocity of first process gas by having first gas outlets 152 that are shaped and sized to emit a supersonic flow of gas into the chamber 110. Because the second gas distributor 144 is radially inward of the first process gas distributor 142, the second gas flow is substantially confined over the surface of the substrate 105 by the high velocity first process gas flow, thereby significantly increasing the utilization and reaction efficiency of the second process gas. This feature may be used to reduce the overall or total flow of process gas into the chamber 110 while still providing good substrate processing rates and reducing gas wastage via the exhaust conduit 162.

Figures 4A, 4B:
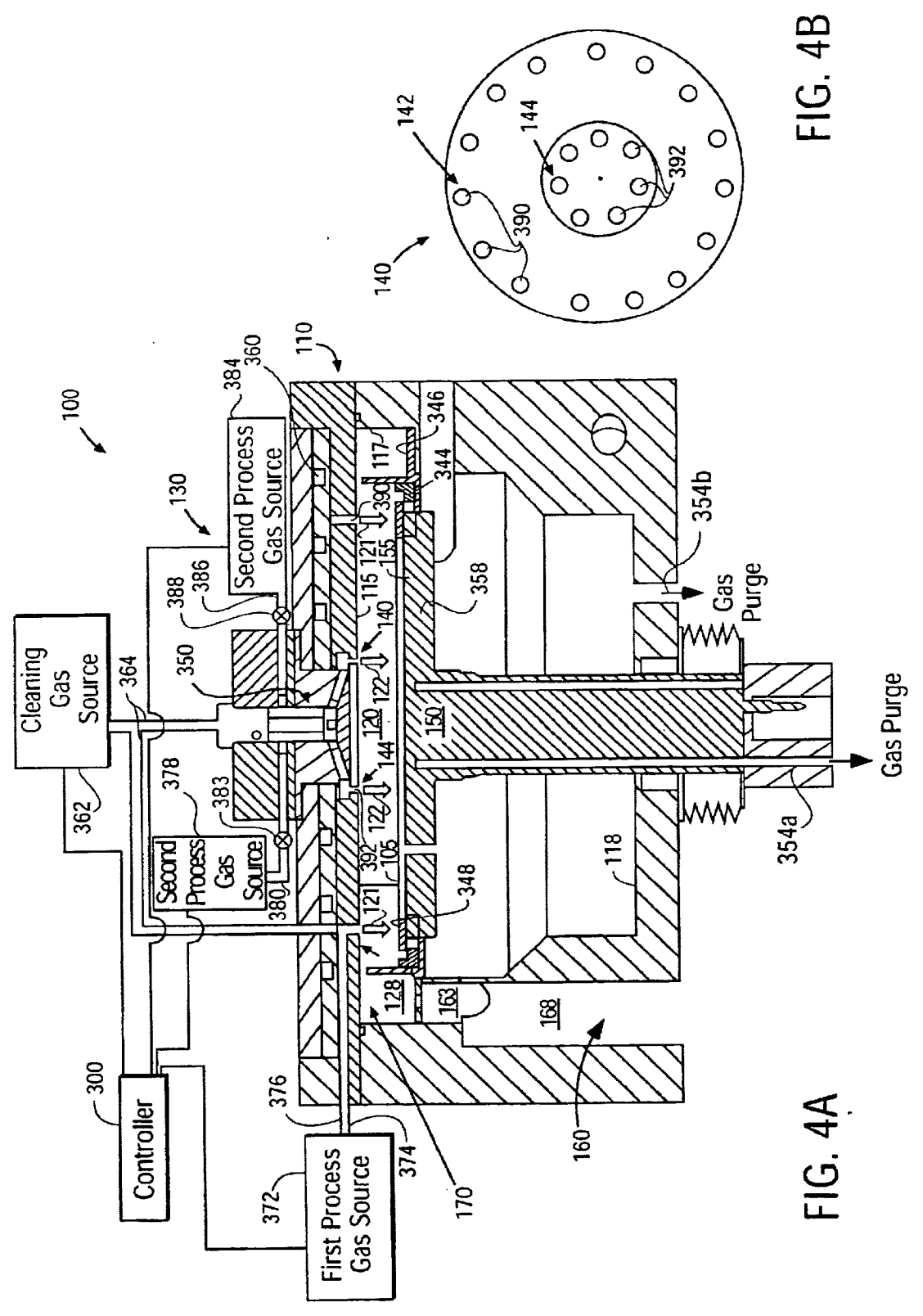

In one embodiment the first process gas source 132a may be a non-reactive gas source that provides a non-reactive gas, and the second process gas distributor 132b may be a reactive gas source that provides a reactive gas. For example, the non-reactive gas may be a diluent or inert gas that serves to contain the reactive gas above the substrate without reacting with the gas or substrate, or that acts as a diluent to energize and promote reaction of the reactive gas with the substrate. For example, the diluent gas may be provided to facilitate the reaction, for example, by serving as neutral gas species to promote plasma formation when energized, by for example, colliding with the energized gas molecules to strip away electrons and form other energized gas species. The diluent gas may be a non-reactive gas, such as argon, that is provided to reduce the resident time of the reactive gases in the chamber 110. When the chamber 110 is used for etching, as shown in FIG. 3a, the reactive gas may be an etching gas suitable for etching material on the substrate. As an example, in the etching of silicon containing substrate material, the reactive gas may comprise a diluent gas such as nitrogen or argon; and the second process gas may comprise a reactive gas such as a halogen containing gas, such as for example, $Cl_2$, $BCl_3$, $HCl$, $F_2$, $CHF_3$, $C_4F_6$, $CF_4$ and equivalents thereof. In another embodiment, when the chamber 110 is for deposition, as shown in FIG. 4a, the reactive gas may be a deposition gas suitable for depositing material on the substrate 105. In some embodiments, the non-reactive gas has a lower density than the reactive gas. In other embodiments, the non-reactive gas is provided at a higher flow rate than the reactive gas. By mixing a process gas composition containing the non-reactive and reactive gases in the process zone 120 above the substrate 105, the volumetric flow of the reactive and non-reactive gases may also be more precisely controlled to obtain desired process gas composition and residence times in the localized region above the substrate 105, without using an excessive reactive gas volume. For example, it has been discovered that the volume of diluent gas may be reduced by a factor of four over conventional mixed gas volumes. A suitable volumetric flow ratio of the first process gas flow rate to the second process gas flow rate is at least about 10:1.

The mixing rate and diffusional properties of the first and second process gases introduced into the chamber 110 may be further controlled by adapting the first gas outlets 152 of the first gas distributor 142 to direct the first process gas in a first flow direction 121 having a first bearing, and adapting the second process gas distributor 144 to direct the second process gas in a second flow direction 122 having a second bearing that is different from the first bearing. The bearings are directions in the chamber 110 that may be, for example, related to the position of the substrate 105 or the location of the exhaust zone 128 about the exhaust conduit 162. For example, a bearing may be away from the substrate 105 and another towards the exhaust conduit 162. For example, in the embodiment illustrated in FIG. 1, the first process gas distributor 142 is adapted to direct the first process gas in a first flow direction 121 having a first bearing toward the exhaust zone 128 or the exhaust conduit 162; and the second gas distributor 144 is adapted to direct the second gas in a second flow direction 122 having a second bearing toward a central portion 106 of the substrate 105. The first and second bearings may be at an angle to one another or may oppose one another, for example, be along substantially opposing compass directions. Directing the first and second process gases in substantially opposing compass directions may provide better control of the process gas composition in the process zone of the chamber 110. For example, directing the first process gas away from the substrate 105 can serve to confine and maintain a reactive second process gas about the substrate 105.

Figure 2A:
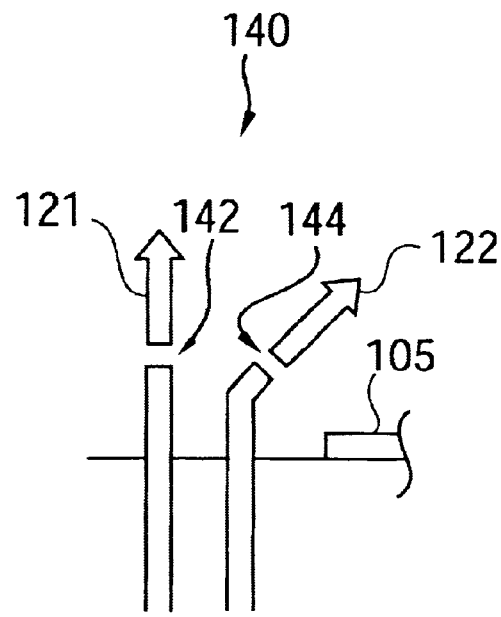
FIGS. 2a and 2b are schematic sectional side views of alternative embodiments of gas distributors according to the present invention.
Figure 2B:
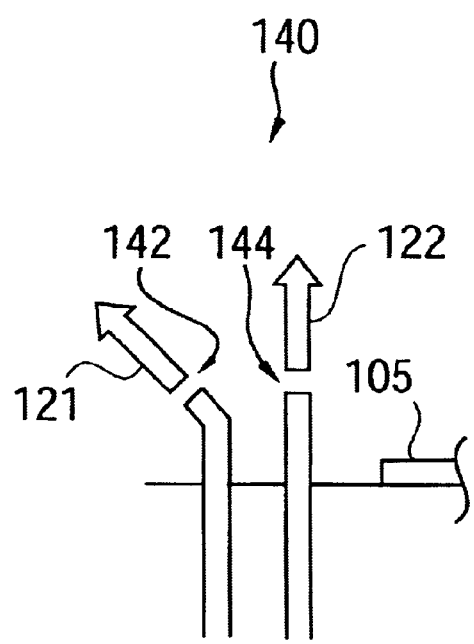

In the versions shown in FIGS. 2a and 2b, the gas distribution system 140 comprises first and second process gas distributors 142, 144 adapted to direct the first and second process gases along flow directions 121, 122, which are at different angles relative to one another. FIG. 2a shows first process gas distributors 142 adapted to direct the first process gas in a vertical direction, and second process gas distributors 144 adapted to direct the second process gas in a flow direction that is at an acute angle relative to the plane of the substrate 105. The vertically oriented flow direction of the first process gas forms a curtain of first process gas around the substrate 105 while the angled flow direction of the second process gas provides this gas over the substrate 105. The angled flow direction is at an angle suitable to allow the process gas to be directed to a specific zone in the chamber 110. The angle may be selected to provide the gas parallel to the surface of the substrate 105, perpendicular to the surface of the substrate 105, or at acute or obtuse angle therebetween. As another example, FIG. 2b shows a version of the first and second process gas distributors 142, 144 in which the first process gas distributor 142 is adapted to direct the first process gas in a flow direction away from the substrate 105 that is at an acute angle relative to the plane of the substrate 105 and the second process gas distributor 144 is adapted to direct the second process gas in a vertically oriented flow direction next to the substrate 105.

EXAMPLE 1

An exemplary version of an apparatus 100 comprising a chamber 110 capable of etching silicon-containing material on a substrate 105 is shown in FIG. 3a. Process gas is introduced into the chamber 110 through a gas distribution system 140 comprising first and second process gas distributors 142, 144 that extend about the perimeter of the substrate 105, and optionally, also through third gas distributors 146 passing through the sidewalls 117 of the chamber 110. The first process gas distributor 142 is adapted to introduce gas along a flow direction that is away from the support 150. The second process gas distributor 142 is adapted to direct gas along a flow direction that is toward the substrate 105. In this chamber, the exhaust conduit 162 extends around the substrate 105 and has one asymmetrical exhaust port 163 that leads to the exhaust line 129 and exhaust pumps 166.

Figure 3B:
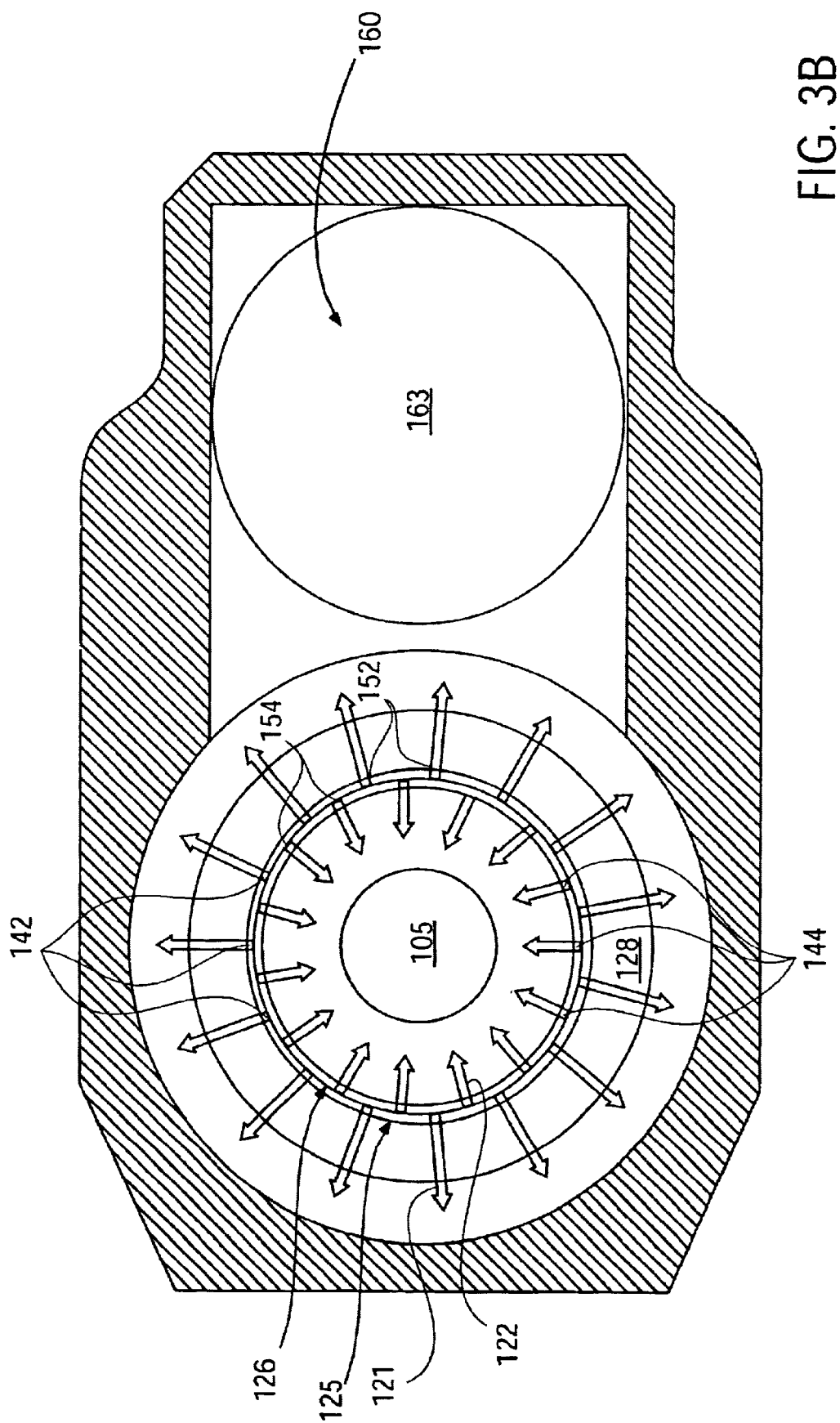
FIG. 3b is a schematic sectional top view of the etching chamber of FIG. 3a showing the flow of process gas into the chamber.

Referring to FIG. 3b, in the chamber 110, the first process gas distributors 142 comprises first gas outlets 152 that are be spaced apart from one another and extending along an outer ring 125 that is radially outward of the second process gas distributor 144 which comprises second gas outlets 154 that are spaced apart from one another and extending along an inner ring 126. The positions of the first and second gas outlets 152, 154 within the rings 125, 126 may also alternate with one another. The arrangement of the first gas outlets 152 provides a flow of first process gas in a flow direction 121 that is generally directed outward from the substrate 105, while the arrangement of the second gas outlets 154 provides an inwardly directed gas flow 122 of second process gas.

In this version, the gas distribution system 140 also comprises an optionally third process gas distributor 146 that extends through the sidewalls 117 to introduce process gas into the chamber 110 from above the substrate 105 and parallel to the plane of the substrate 105. The third gas distributors 146 may be supplied with process gas via a conduit 135 from a third process gas source 132c. The third gas distributor 146 may also introduce one or more of the first and second process gases, as supplied by the first or second process gas sources 132a,b. The process gas introduced from above the substrate 105 is provided directly over the substrate 105 to at least partially mix with the process gases from the first and second process gas distributors 142, 144 to form a desired composition of the process gas in the chamber 110. For example, the third gas distributor 146 may introduce an active or diluent process gas which may mix with other diluent and active process gases introduced by the first and second process gas distributors 142, 144 to provide a composition of process gas suitable to uniformly etch the substrate 105. Thus, the first, second and third gas distributors 142, 144, 146 may be used to introduce process gases that diffuse into one another to provide a composition of process gas above the substrate 105 that has a residence time suitable for processing the substrate 105.

An energized gas is generated from the mixed process gas by a gas energizer 170 comprising an antenna 156 adjacent to the ceiling 118 that includes coils 158 having a circular symmetry with a central axis coincident with the longitudinal vertical axis that extends through the process chamber 110. The gas energizer 170 also comprises process electrodes 103, 178 that include a first electrode 103 comprising a ceiling 115 of the chamber and a second electrode 178 in the support 150 below the substrate 105, that are powered by power source 182 having AC and DC power supplies. The ceiling 115 comprises a semiconductor material that is sufficiently electrically conductive to be biased or grounded to form an electric field in the chamber 110 yet provides low impedance to an RF induction field transmitted by the antenna 156 above the ceiling 115. A suitable semiconductor material comprises semiconducting silicon having a resistivity of less than about 500 Ω-cm at room temperature. The second electrode 178 is typically fabricated from a metal such as tungsten, tantalum, or molybdenum, and is covered by or embedded in a dielectric 174. The second electrode 178 may also serve as an electrostatic chuck 168 that generates an electrostatic charge for electrostatically holding the substrate 105 to the receiving surface 155 of the support 150. Heater lamps 179 also may be provided to heat the support 150 and overlying substrate 105 to suitable temperatures. The frequency of the RF voltage applied to the antenna 156 or process electrodes 103, 178 is typically from about 50 KHz to about 60 MHz and the power level of RF voltage is typically from about 100 Watts to about 5000 Watts.

The temperature of the ceiling 115 is held in a range of temperatures at which the semiconductor material provides semiconducting properties and in which the carrier electron concentration is fairly constant with respect to temperature. For silicon, the temperature range may be from about 100 K (below which silicon begins to have dielectric properties) to about 600 K (above which silicon begins to have metallic conductor properties). The temperature of the ceiling 115 is controlled using a plurality of radiant heaters such as tungsten halogen lamps 106 and a thermal transfer plate 107 made of aluminum or copper, with passages (not shown) for a heat transfer fluid to flow there through. A heat transfer fluid source (not shown) supplies heat transfer fluid to the passages to heat or cool the thermal transfer plate 107 as needed to maintain the chamber 110 at a constant temperature. The semiconducting ceiling 115 is in thermal contact with the plate 107 via a plurality of highly thermally conductive rings 109 whose bottom surface rests on the ceiling 115 and whose top surface supports the plate 107. Positioned around the lower portion of the heat transfer rings 109 is the inductor antenna 156. The height of the heat transfer rings 109 is selected so that the plate 107 is supported at a distance above the inductor antenna 156 of at least one half the overall height of the antenna. This mitigates or eliminates the reduction in inductive coupling between the antenna 156 and the plasma which would otherwise result from their close proximity to the conductive plane of the plate 107.

Figure 5:
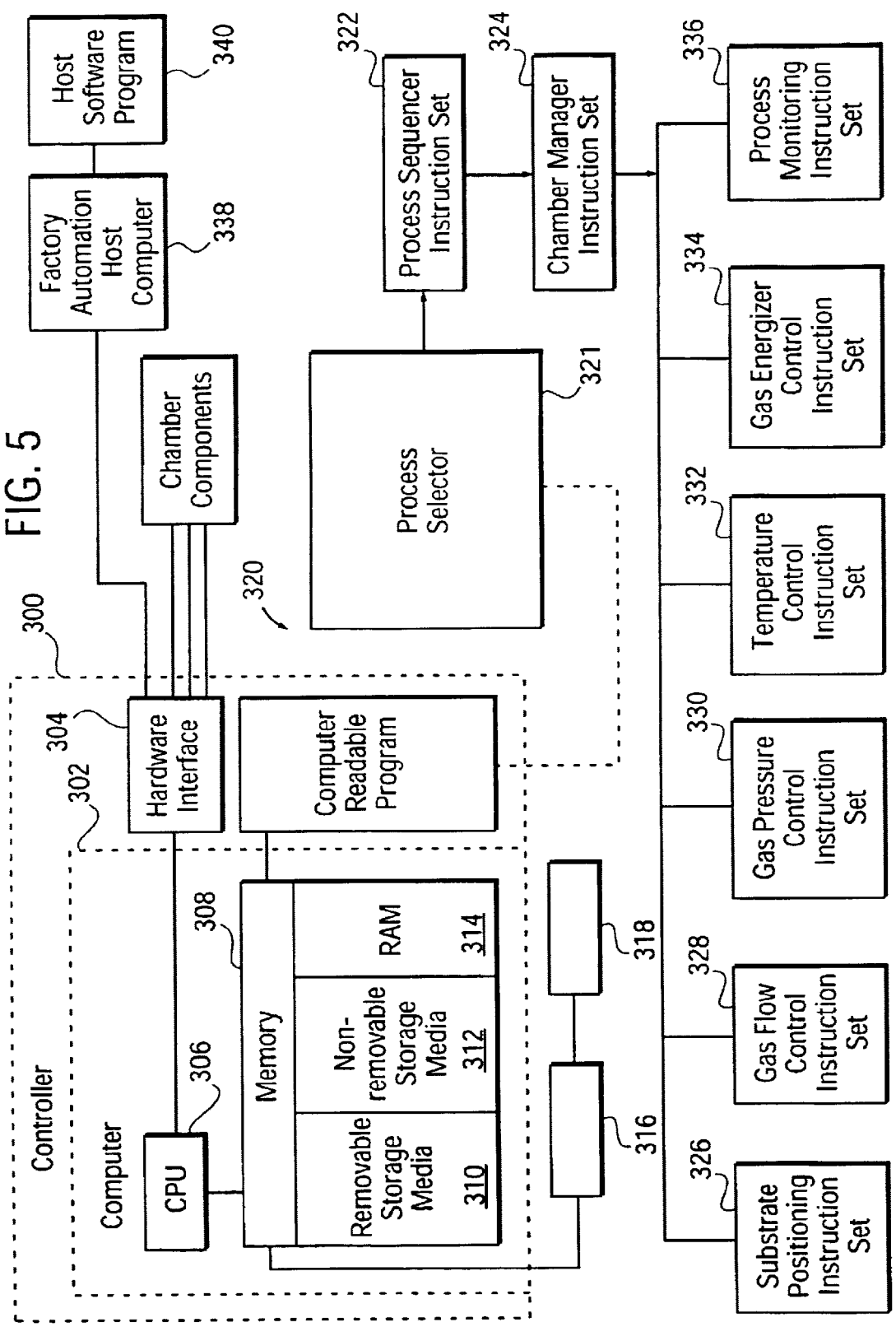
FIG. 5 is an illustrative block diagram of an embodiment of a controller according to the present invention.

The chamber 110 may be operated by a controller 300 via a hardware interface 304. The controller 110 operates the substrate support 150 to raise and lower the support 150, the gas flow meters 137, 138 and 139, the gas energizer 170, and the throttle valve 164, to process the substrate 105 in an energized gas. The controller 300 may comprise a computer 302 which may comprise a central processor unit (CPU) 306, such as for example a 68040 microprocessor, commercially available from Synergy Microsystems, Calif., or a Pentium Processor commercially available from Intel Corporation, Santa Clara, Calif., that is coupled to a memory 308 and peripheral computer components, as shown in FIG. 5. The memory 308 may include a removable storage media 310, such as for example a CD or floppy drive, a non-removable storage media 312, such as for example a hard drive, and random access memory 314. The controller 300 may further comprise a plurality of interface cards including, for example, analog and digital input and output boards, interface boards, and motor controller boards. The interface between an operator and the controller 300 can be, for example, via a display 316 and a light pen 318. The light pen 318 detects light emitted by the monitor display 316 with a light sensor in the tip of the light pen 318. To select a particular screen or function, the operator touches a designated area of a screen on the monitor 316 and pushes the button on the light pen 318. Typically, the area touched changes color, or a new menu is displayed, confirming communication between the user and the controller 300.

The data signals received and evaluated by the controller 300 may be sent to a factory automation host computer 338. The factory automation host computer 338 may comprise a host software program 340 that evaluates data from several systems, platforms or chambers 110, and for batches of substrates 105 or over an extended period of time, to identify statistical process control parameters of (i) the processes conducted on the substrates 105, (ii) a property that may vary in a statistical relationship across a single substrate 105, or (iii) a property that may vary in a statistical relationship across a batch of substrates 105. The host software program 340 may also use the data for ongoing in-situ process evaluations or for the control of other process parameters. A suitable host software program comprises a WORK-STREAM™ software program available from aforementioned Applied Materials. The factory automation host computer 338 may be further adapted to provide instruction signals to (i) remove particular substrates 105 from the processing sequence, for example, if a substrate property is inadequate or does not fall within a statistically determined range of values, or if a process parameter deviates from an acceptable range; (ii) end processing in a particular chamber 110, or (iii) adjust process conditions upon a determination of an unsuitable property of the substrate 105 or process parameter. The factory automation host computer 338 may also provide the instruction signal at the beginning or end of processing of the substrate 105 in response to evaluation of the data by the host software program 340.

In one version, the controller 300 comprises a computer-readable program 320 that may be stored in the memory 308, for example on the non-removable storage media 312 or on the removable storage media 310. The computer readable program 320 generally comprises process control software comprising program code to operate the chamber 110 and its components, process monitoring software to monitor the processes being performed in the chamber 110, safety systems software, and other control software, as for example, illustrated in FIG. 5. The computer-readable program 320 may be written in any conventional computer-readable programming language, such as for example, assembly language, C++, Pascal, or Fortran. Suitable program code is entered into a single file, or multiple files, using a conventional text editor and stored or embodied in computer-usable medium of the memory 308. If the entered code text is in a high level language, the code is compiled, and the resultant compiler code is then linked with an object code of pre-compiled library routines. To execute the linked, compiled object code, the user invokes the object code, causing the CPU 306 to read and execute the code to perform the tasks identified in the program.

An illustrative block diagram of a hierarchical control structure of a specific embodiment of a computer readable program 320 according to the present invention is also shown in FIG. 5. Using a light pen interface 318, for example, a user enters a process set and chamber number into the computer readable program 320 in response to menus or screens displayed on the display 318, such as a CRT terminal, that make up a process selector 321. The computer readable program includes program code to control the substrate position, gas flow, gas pressure, temperature, RF power levels, and other parameters of a particular process, as well as code to monitor the chamber process. The process sets are predetermined groups of process parameters necessary to carry out specified processes. The process parameters are process conditions, including without limitations, gas composition, gas flow rates, temperature, pressure, and gas energizer settings such as RF or microwave power levels.

The process sequencer instruction set 322 comprises program code to accept a chamber type and set of process parameters from the computer readable program 320 or the process selector 321 and to control its operation. The sequencer program 322 initiates execution of the process set by passing the particular process parameters to a chamber manager instruction set 324 that controls multiple processing tasks in the process chamber 110. The process chamber instruction set 324 may include, for example, a substrate positioning instruction set 326, a gas flow control instruction set 328, a gas pressure control instruction set 330, a temperature control instruction set 332, a gas energizer control instruction set 334, and a process monitoring instruction set 336. The substrate positioning instruction set 326 may comprise program code for controlling chamber components that are used to load the substrate 105 onto the support 150, and optionally, to lift the substrate 105 to a desired height in the chamber 110. The gas pressure control instruction set 330 comprises program code for controlling the pressure in the chamber 110 by regulating open/close position of the throttle valve 164. The temperature control instruction set 332 may comprise, for example, program code for controlling the temperature of the substrate 105 during processing. The gas energizer control instruction set 334 comprises program code for setting, for example, the RF power level applied to the antenna 156. The process monitoring instruction set 336 may comprise program code to monitor a process in the chamber 110. The gas flow control instruction set 328 comprises program code for controlling the flow rates of different constituents of the process gas. For example, the gas flow control instruction set 328 may regulate the opening size of the gas flow control meters 137, 138, 139 to obtain the desired gas flow rates from the process gas distributors 142, 144, 146 into the chamber 110. In one version, the gas flow control instruction set 328 comprises program code to set a first volumetric flow rate of the first process gas introduced through the first gas distributor 142, and a second volumetric flow rate of a second process gas introduced through a second process gas distributor 144. The gas flow instruction set 328 may also set a volumetric flow ratio of the first process gas to the second process gas.

While described as separate instruction sets for performing a set of tasks, it should be understood that each of these instruction sets can be integrated with one another, or the tasks of one set of program code integrated with the tasks of another to perform the desired set of tasks. Thus, the controller 300 and the computer program code described herein should not be limited to the specific version of the functional routines described herein; and any other set of routines or merged program code that perform equivalent sets of functions are also in the scope of the present invention. Also, while the controller is illustrated with respect to one version of the chamber 110, it may be used for any chamber described herein.

EXAMPLES 2–7

Figure 6:
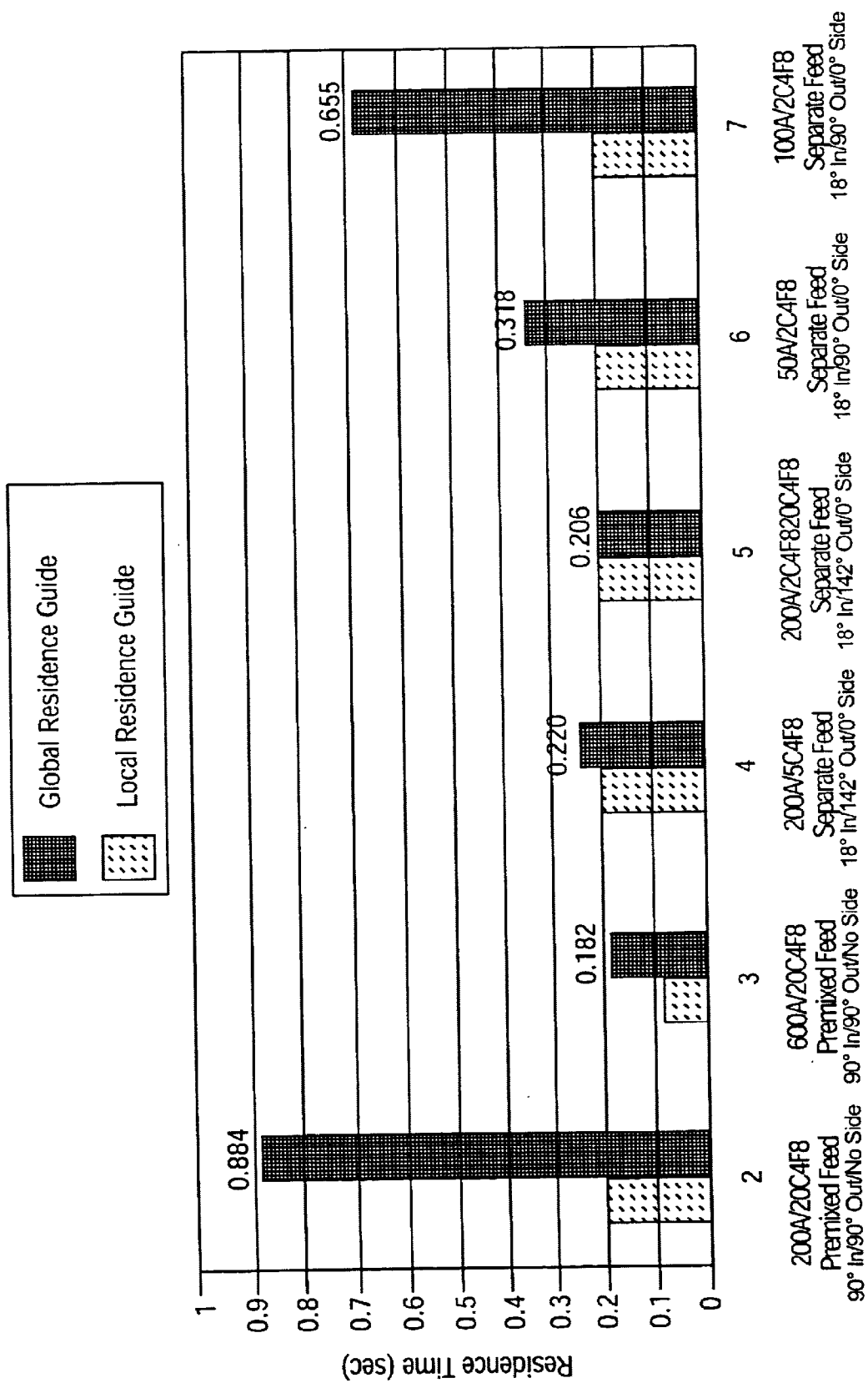
FIG. 6 is a graph comparing the modeled local and global process gas residence times for different process gas distributors and gas flow rates.

In these Examples, the process gas residence time was modeled for different process gas distributor configurations and gas flow rates in the chamber of Example 1. FIG. 6 shows a graph comparing the local and global process gas residence time modeled for the gas distributor configurations and flow rates. This graph demonstrates that good localized gas residence times may be obtained for much smaller flow rates of the process gas when a gas distribution system 140 comprising first and second process gas distributors 142, 144 according to the present invention are used in the process chamber 110, as compared to a conventional process gas distribution system.

In Example 2, a conventional gas distribution system in which the process gases were mixed outside the chamber and introduced into the chamber through a single set of gas distributors was used for comparison purposes. This gas distributor directed the gas into the chamber at 90 degrees to the substrate surface. The exhaust conduit was also at 90 degrees relative to the substrate surface. When a process gas mixture comprising 200 sccm argon diluent gas and 20 sccm $C_4F_8$ active gas was introduced into the chamber through the gas distributors, a localized residence time over the substrate surface was predicted to be approximately 200 msec which is more desirable because this results in better etching selectivity and control. However, a large global residence time of 0.884 seconds was predicted by the gas flow model across the volume of the chamber.

In Example 3, the gas distributor was also of the same conventional configuration as in Example 2. However, a process gas mixture comprising a much larger diluent flow rate of 600 sccm argon was introduced into the chamber 110 through the gas distributors. This resulted in a significant reduction of the predicted global residence time to 182 msec across the chamber 110, which is more desirable. However, the predicted local residence time was reduced to 100 msec. The large combined process gas flow rate of 620 sccm used in this example is also undesirable as a larger volume of gas must be exhausted form the chamber 110, requiring more abatement and scrubbing processes.

In Example 4 the gas distribution system 140 comprised a second process gas distributor 144 adapted to introduce a reactive gas in a flow direction towards the substrate 105 at an angle 18 degrees relative to the substrate plane, and the first process gas distributor 142 was adapted to introduce a diluent gas in a flow direction away from the substrate 105 and at an angle of about 142 degrees relative to the substrate plane. The gas distribution system 140 further comprises a third gas distributor 146 adapted to introduce process gas in a flow direction towards the substrate 105 and at an angle of 0 degrees to the substrate plane. When a reactive gas comprising 5 sccm $C_4F_8$ was introduced into the chamber 110 through the second process gas distributor 144 and a diluent gas comprising 200 sccm argon was introduced into the chamber 110 through the first process gas distributor 142, a smaller global residence time of 220 msec was predicted by the gas flow model across the chamber 110. The localized residence time over the substrate surface was predicted to be about 200 msec. Thus, in comparison to the conventional configuration, the gas distribution system 140 was predicted to provide a reduced global residence time and a good local residence time with a reduced overall process flow rate.

In Example 5, the gas distribution system 140 was of the same configuration as that in Example 4, however, the reactive gas was introduced into the chamber 110 at a much smaller flow rate of 2 sccm $C_4F_8$. This resulted in a decrease in the predicted global residence time to 200 msec across the chamber 110 and an increased predicted local residence time of 206 msec. Thus, even with a reduced flow rate of active gas, the gas distributor of the present invention provides good predicted local residence times and reduced predicted global residence times with a reduced overall process flow rate.

In Example 6, the gas distribution system 140 comprised separate first and second process gas distributors 142, 144, also according to the present invention. However the first process gas distributor 142 was adapted to introduce the diluent gas at an angle of about 90 degrees relative to the substrate plane, and the second process gas distributor 144 was adapted to introduce the active gas in a flow direction towards the substrate 105 at an angle 18 degrees relative to the substrate plane. A third gas distributor 146 was adapted to introduce process gas in a flow direction towards the substrate 105 and at an angle of 0 degrees to the substrate plane. When an active gas comprising 2 sccm $C_4F_8$ was introduced into the chamber 110 through the second process gas distributor 144 and a diluent gas comprising 50 sccm argon was introduced into the chamber 110 through the first process gas distributor 142, a global residence time of 200 msec was predicted by the gas flow model across the chamber 110 with a good predicted local residence time of 318 msec. Thus, while the gas distributor configuration provided a higher predicted local residence time than the gas distributor configuration of Examples 4 and 5, the predicted global residence times were still an improvement over the conventional gas distributor configuration for the overall process flow rate used.

In Example 7, the gas distributor was of the same configuration as that in Example 6, however, the diluent gas was introduced into the chamber 110 at a much larger flow rate of 100 sccm Ar. This resulted in an increase in the predicted local residence time to 655 msec across the chamber 110 with a global residence time of 200 msec. Thus while increasing the flow rate of the diluent gas increased the predicted global residence time, the gas distributor configuration still provided better predicted global residence times over the conventional gas distributor configuration for the total or overall process flow rates.

These examples show that diluent and process gases introduced through the separate first and second process gas distributors 142, 144 reduce the global residence time and increase the local residence with a reduced overall flow rate of process gas. The gas distributor configuration with first process gas distributors 142 adapted to direct the diluent gas away from the substrate 105, as in Examples 4 and 5, yields good predicted local residence times with low predicted global residence times and reduced overall flow rates of process gas.

EXAMPLE 8

Example 8 illustrates another version of an apparatus 100 according to the present invention comprising a deposition chamber 110, as shown in FIG. 4a, that is useful for depositing material on the substrate 105 by a chemical vapor deposition process in which a deposition gas is introduced into the chamber and energized by heat and/or RF energy to deposit a layer on the substrate 105. The chamber 110 comprises a ceiling 115, sidewall 117, and bottom wall 118, which are typically fabricated from a metal, and enclose a process zone 120 having a support 150 with a substrate receiving surface 155. The gas supply 130 introduces process gas into the chamber 110 through a gas distribution system 140 that is fed by one or more process gas sources 372, 378, 384, via the conduits 374, 380, 386, respectively, each conduit having one or more flow meters 376, 382, and 388, respectively. A shadow ring 348 surrounds the perimeter of the substrate 105. Typically the height between the substrate 105 and the ceiling 117 is from about 1 to 1.5 inches. An outer ring 344 and a pumping ring 346 surround the substrate 105 to limit the access of the deposition gases to the sidewall 117 to reduce excess residue formation on the sidewalls. Spent process gas and process byproducts are exhausted from the chamber 110 via an exhaust system 160 comprising an exhaust zone 128 about an exhaust conduit 162 that has one or more exhaust ports 163.

In the illustrated version of the CVD chamber 110, the gas distribution system 140 comprises a first gas distributor 142 to introduce a non-reactive gas into the chamber 110 and a second process gas distributor 144 to introduce a reactive deposition gas into the chamber 110. The first gas distributor 142 introduces the non-reactive gas circumferentially about the perimeter of the substrate 105 as shown by the arrows 121, and the second process gas distributor 144 introduces the deposition gas from directly above the substrate 105 as shown by the arrows 122. In one version, the first process gas distributor 142 has a series of gas outlets 390 that are positioned circumferentially around, and spaced apart from the gas outlets 392 of the second process gas distributor 144, as shown in FIG. 7b. The first and second process gases may be a single gas or a mixture of gases. In one embodiment, the non-reactive gas is argon, and the deposition gas is a mixture of reactive gases, which can deposit material on the substrate in the CVD process. The deposition gas may be a gas suitable to deposit a metal, for example, tungsten may be deposited by introducing $WF_6$ and argon from one of the second process gas sources 384, and introducing $H_2$ from the other second process gas source 378, into a mixer 350. The $WF_6$, $H_2$ and argon gases are mixed in the mixer 350 and then are introduced into the chamber 100 via the second process gas distributor 144.

The mixed deposition gas is distributed into the chamber from the second process gas distributor 144 in the flow direction 122 which is toward and from above the substrate 105. The deposition gas spreads across the substrate surface and is partially contained by the curtain of non-reactive argon gas released from the first process gas distributor 142 around the perimeter of the substrate 105. The non-reactive gas and reactive gases partially diffuse into one another to form a diffused process gas having a predetermined composition that is suitable for depositing a uniform film of material on the substrate 105. The separate gas distributors 142, 144, allow control over mixing of the process gases in the localized environment above the substrate 105, by introducing the non-reactive gas about the substrate perimeter and introducing the reactive deposition gas over the central portion of the substrate 105 to efficiently deposit material on the substrate. The non-reactive gas can also be purged from the chamber 110 via the purging outlets 354a,b. By controlling the flow rate of the non-reactive gas the localized residence time of the deposition and non-reactive gases in the chamber and above the substrate 105 and above the substrate 105 may be controlled. In this manner, the gas distribution system 140 increases the utilization efficiency of the deposition gases immediately above the substrate surface, and reduces undesirable residue deposition on the chamber walls and components about the substrate 105.

In one version, the process gas in the chamber 110 is energized to process the substrate 105 by a gas energizer 170 that couples energy to the gas in the process zone 120 of the chamber 110. The gas energizer 170 comprises process electrodes that include an electrode formed by a wall, such as a sidewall 117 or ceiling 115 of the chamber 110, that is capacitively coupled to another electrode formed by the support 150 below the substrate 105. A power supply (not shown) provides, for example, RF power to the electrodes at a frequency of typically about 50 KHz to about 60 MHz, and at a power level of from about 100 to about 5000 Watts.

The chamber may also have a cleaning gas source 362 that provides an energized cleaning gas to the chamber 110 to clean off deposition residues from the surfaces inside the chamber 110. The energized cleaning gas may be, for example, $NF_3$ or $CF_4$, that is energized by microwaves or RF energy in a remote chamber before it is introduced into the chamber 110. The cleaning gas is passed through the conduit 364 that feeds into the chamber 110 from above the substrate 105 through one or more of the gas outlets 390 and 392.

The substrate 105 may also be heated by a heater 358 that heats the support 150 supporting the substrate 105, to a temperature sufficiently high to cause the deposition gas to preferentially deposit material on the substrate 105. The heater 358 may be a resistive element embedded in the support or lamps that direct radiant energy onto the support 150. Cooling channels 360 may also be provided in the ceiling 115 to cool the ceiling and to reduce the deposition of material thereon. A controller 300 controls operation of the chamber components to process the substrate 105 in an energized gas.

Although the present invention has been described in considerable detail with regard to certain preferred versions thereof, other versions are possible. Also, the apparatus of the present invention can be used in other chambers and for other processes, such as physical vapor deposition and chemical vapor deposition. Therefore, the appended claims should not be limited to the description of the preferred versions contained herein.

What is claimed is:

1. A substrate processing chamber comprising:
    a substrate support to support a substrate, the substrate having a central portion and a perimeter;
    an exhaust conduit having A throttle valve;
    a first process gas distributor comprising one or more first gas outlets about the perimeter of the substrate, the first gas outlets adapted to direct a first process gas away from the substrate or in a vertical direction, and a first flow meter to regulate a first flow rate of the first process gas through the first gas outlets;
    a second process gas distributor comprising one or more second gas outlets about the perimeter of the substrate, the second gas outlets adapted to direct a second process gas toward the central portion of the substrate, and a second flow meter to regulate a second flow rate of the second process gas through the second gas outlets;
    a gas energizer to energize the gases in the chamber; and
    a controller comprising program code to (i) set the first flow meter to provide the first flow rate of the first process gas through the first gas outlets, and (ii) set the second flow meter to provide the second flow rate of the second process gas through the second gas outlets.

2. A chamber according to claim 1 wherein the controller comprises program code to set the first and second flow meters to provide a first flow rate that is higher than the second flow rate.

3. A chamber according to claim 2 wherein the controller comprises program code to set the first and second flow meters to provide a first flow rate that is sufficiently higher than the second flow rate to form a curtain of the first process gas about the second process gas.

4. A chamber according to claim 2 wherein the controller comprises program code to set the first and second flow meters to provide a ratio of the first flow rate to the second flow rate of at least about 10:1.

5. A chamber according to claim 1 wherein the exhaust conduit extends at least partially about the substrate perimeter, and wherein the first gas outlets are adapted to direct the first process gas towards the exhaust conduit.

6. A chamber according to claim 5 wherein the first gas outlets are positioned between the exhaust conduit and the second gas outlets.

7. A chamber according to claim 1 wherein the first process gas distributor comprises a conduit to receive a first process gas comprising a nun-reactive gas from a non-reactive gas source, and the second process gas distributor comprises a conduit to receive a second process gas comprising a reactive gas from a reactive gas source.

8. A chamber according to claim 7 wherein the non-reactive gas comprises a diluent or inert gas, and the reactive gas comprises an etching gas suitable for etching material on the substrate.

9. A chamber according to claim 7 wherein the non-reactive gas comprises a diluent or inert gas, and the reactive gas comprises a deposition gas suitable for depositing material on the substrate.

10. A chamber according to claim 1 wherein the first or second gas outlets are arranged in an annulus.

11. A substrate processing chamber comprising:
a substrate support to support a substrate, the substrate having a perimeter;
an exhaust conduit at least partially about the substrate support, the exhaust conduit having a throttle valve;
a gas distributor comprising
   (i) first gas outlets about the perimeter of the substrate, the first gas outlets adapted to direct a first process gas toward the exhaust conduit, and a first flow meter to regulate the flow of the first process gas to a first flow rate, and
   (ii) second gas outlets about the perimeter of the substrate, the second gas outlets adapted to direct a second process gas toward the substrate, and a second flow meter to regulate the flow rate of the second process gas to a second flow rate;
a gas energizer to energize the gases in the chamber; and
a controller comprising program code to (i) set the first flow meter to provide the first flow rate of the first process gas through the first gas outlet, and (ii) set the second flow meter to provide the second flow rate of the reactive second process gas through the second gas outlets.

12. A chamber according to claim 11 wherein the controller comprises program code to set the first and second flow meters to provide a ratio of the first flow rate to the second flow rate of at least about 10:1.

13. A chamber according to claim 11 wherein the controller comprises program code to set the first and second flow meters to provide a first flow rate that is higher than the second flow rate.

14. A chamber according to claim 11 wherein the controller comprises program code to set the first and second flow meters to provide a first flow rate that is sufficiently higher than the second flow rate to form a curtain of the first process gas about the second process gas.

15. A chamber according to claim 11 wherein the exhaust conduit extends at least partially about the substrate perimeter, and wherein the first gas outlets are adapted to direct the first process gas toward the exhaust conduit.

16. A chamber according to claim 11 wherein the first gas outlets are positioned between the exhaust conduit and the second gas outlets.

17. A chamber according to claim 11 wherein the first process gas distributor comprises a conduit to receive a first process gas comprising a non-reactive gas from a non-reactive gas source, and the second process gas distributor comprises a conduit to receive a second process gas comprising a reactive gas from a reactive gas source.

18. A chamber according to claim 17 wherein the non-reactive gas comprises a diluent or inert gas, and the reactive gas comprises an etching gas suitable for etching material on the substrate.

19. A chamber according to claim 17 wherein the non-reactive gas comprises a diluent or inert gas, and the reactive gas comprises a deposition gas suitable for depositing material on the substrate.

20. A chamber according to claim 11 wherein the first or second gas outlets are arranged in an annulus.

21. A substrate processing chamber comprising:
a substrate support to support a substrate, the substrate having a central portion and a perimeter;
an exhaust conduit having a throttle valve;
a first process gas distributor comprising one or more first gas outlets about the perimeter of the substrate to direct a first process gas away from the substrate or in a vertical direction, and a first flow meter to regulate a first flow rate of the first process gas through the first gas outlets;
a second process gas distributor comprising one or more second gas outlets about the perimeter of the substrate to direct a second process gas toward the central portion of the substrate, and a second flow meter to regulate a second flow rate of the second process gas through the second gas outlets;
a gas energizer to energize the gases in the chamber; and
means for (i) setting the first flow meter to provide the first flow rate of the first process gas through the first gas outlets, (ii) setting the second flow meter to provide the second flow rate of the second process gas through the second gas outlets.

22. A substrate processing chamber comprising:
a substrate support to support a substrate, the substrate having a perimeter;
an exhaust conduit at least partially about the substrate support, the exhaust conduit having a throttle valve;
a gas distributor comprising
   (i) first gas outlets about the perimeter of the substrate to direct a first process gas toward the exhaust conduit, and a first flow motor to regulate the flow of the first process gas to a first flow rate, and
   (ii) second gas outlets about the perimeter of the substrate to direct a reactive gas toward the substrate, and a second flow meter to regulate the flow rate of the second process gas to a second flow rate;
a gas energizer to energize the gases in the chamber; and
means for (i) selling the first flow meter to provide the first flow rate of the non-reactive gas through the first gas outlets, (ii) setting the second flow meter to provide the second flow rate of the reactive gas through the second gas outlets.

* * * * *